United States Patent [19]

Bull et al.

[11] Patent Number: 5,192,835
[45] Date of Patent: Mar. 9, 1993

[54] BONDING OF SOLID STATE DEVICE TO TERMINAL BOARD

[75] Inventors: David N. Bull, Rochester; Edward J. Ozimek, Penfield; Terry Tarn, Pittsford, all of N.Y.

[73] Assignee: Eastman Kodak Company, Rochester, N.Y.

[21] Appl. No.: 594,786

[22] Filed: Oct. 9, 1990

[51] Int. Cl.$^5$ ............................................ H05K 1/00
[52] U.S. Cl. .................................... 174/260; 174/259; 228/208; 228/56.3
[58] Field of Search ............... 174/256, 257, 259, 260, 174/261; 361/405, 406; 228/238, 208, 56.3

[56] References Cited

U.S. PATENT DOCUMENTS

| | | | |
|---|---|---|---|
| 3,632,410 | 1/1972 | Vargo | 228/193 |
| 3,702,500 | 11/1972 | Gorinas | 174/257 |
| 3,839,780 | 10/1974 | Freedman | 228/238 |
| 3,953,924 | 5/1976 | Zachry | 174/262 |
| 4,435,611 | 3/1984 | Ohsawa et al. | 174/257 |
| 4,754,900 | 7/1988 | MacKay | 222/590 |
| 4,895,291 | 1/1990 | Ozimek et al. | 228/121 |
| 5,022,580 | 6/1991 | Pedder | 228/56.3 |

OTHER PUBLICATIONS

Bardy, George S. and Henry R. Clauser, *Material Handbook*, Eleventh Edition, McGraw-Hill Book Comp., N.Y., 1977, p. 48.
Abstract-C. A. MacKay, International Electronic Packaging Conf., San Diego, Calif., Sep. 11-13, 1989, published in the Conference Proceedings, pp. 1244-1259, Int. Electronic Packaging Society, 1989.

*Primary Examiner*—Leo P. Picard
*Assistant Examiner*—Trinidad Korka
*Attorney, Agent, or Firm*—Stephen C. Kaufman

[57] ABSTRACT

The present invention relates to a solid state assembly having a solid state device bonded to a terminal board of an insulating material having a plurality of metal terminal pads thereon and arranged in a pattern. A metal bump is on each of the terminal pads of the terminal plate with an amalgam layer covering at least a top of each bump. The solid state device has a plurality of metal terminal pads thereon. The solid state device is mounted on the terminal board with each of its terminal pads being seated on the amalgam of each bump on the terminal board. The assembly is formed by placing some amalgam on each of the bumps on the terminal plate. The solid state device is then mounted on the terminal plate and the amalgam is hardened, such as by heating at a low temperature, to bond the amalgam to the bumps and the solid state device terminal plates. Once the device is bonded to the terminal board, the temperature the assembly is subject to can be higher than the temperature used for the bonding operation without causing any harm to the bond.

19 Claims, 1 Drawing Sheet

BONDING OF SOLID STATE DEVICE TO TERMINAL BOARD

FIELD OF THE INVENTION

The present invention relates to a solid state device bonded to a terminal board and method of making the bond, and, more particularly, to the use of an amalgam for flip-chip bonding a solid state device to a terminal board.

BACKGROUND OF THE INVENTION

One technique for mounting a solid state device, such as an integrated circuit, on a terminal board is known as the "flip-chip" technique. For this technique, the solid state device is provided with small bumps of a tin/lead solder or indium on the terminal pads of the device. The solid state device is then mounted on the terminal board with the solder bumps being seated on corresponding terminal pads on the terminal board. The assembly is then heated to the melting temperature of the solder bumps which then bond to the terminal pads of the solid state device and terminal board. Another technique is to form gold bumps on the terminal pads of the solid state device. The solid state device is then mounted on the terminal board with the gold bumps contacting the corresponding terminal pads on the terminal board. The solid state device is secured in place on the terminal board by a resin.

Although the flip-chip technique provided for ease of mounting a solid state device on a terminal board without the need of connecting terminal wires, for some types of solid state devices it is not practical. For example, solid state image sensors often have features, such as organic color filters, thereon which interfere with the use of the flip-chip technique. Building solder bumps onto such an image sensor is not practical since the topography of the bumps cause uniformity problems for the color filter arrays. Building the bumps onto the image sensor after the color filters have been processed will cause damage to the fragile filters since they cannot withstand the necessary photoresist processes required for making the bumps. In addition, the color filters cannot withstand the high temperatures required to solder the bumps to the terminal board. Therefore, forming the bumps on the terminal board for contact with terminal pads on the image sensor still will not be satisfactory. The resin attachment technique also is not satisfactory since it may effect the image sensing capability of the sensor because of distortions in the light received by the sensor. Also, the usual ultra violet cure for the resin may affect the color filters.

Therefore, it would be desirable to have a flip-chip technique for mounting on a terminal board solid state devices which have features which are adversely affected by high temperatures which can be carried out at low temperatures which do not adversely affect the solid state device. Low temperature solders have been developed for use in bonding parts together, such as the cover plate and housing of an image sensor package, as shown in U.S. Pat. No. 4,895,291 to E. J. Ozimek et al, issued Jan. 23, 1990, entitled "Method of Making a Hermetic Seal in a Solid-State Device" and assigned to the assignee of the present application. However, the problem with such low temperature solders is that if the assembly is subjected to the same low temperatures during the use thereof, the solder will melt and allow the parts to come apart. Therefore, it is desirable to have a bonding technique which not only can be carried out at low temperatures, below the maximum allowable processing temperature, but will withstand much higher temperatures after the bond is formed.

SUMMARY OF THE INVENTION

Viewed from one aspect the present invention is directed to a solid state device mounted on a terminal board in which the terminal board has solder bumps on terminal pads thereon and an amalgam is used to bond terminal pads on the solid state device to the solder bumps. More particularly, the present invention relates to a mounting for a solid state device comprising a terminal board having a plurality of metal terminal pads thereon in a pattern. A metal bump is on each of the terminal pads of the terminal board. A solid state device has a plurality of metal terminal pads thereon in a pattern corresponding to the pattern of the terminal pads on the terminal board. The solid state device is over the terminal board with the terminal pads of the solid state device being adjacent the bumps on the terminal board. An amalgam is between and bonded to the bumps and the terminal pads on the solid state device to secure the solid state device on the terminal board. The solid state device is mounted on the terminal board by providing bumps on terminal pads on the terminal board and applying an amalgam to each bump. The solid state device is placed over the terminal board with terminal pads on the solid state device contacting the amalgam on the bumps. The amalgam is then bonded to the bumps and the terminal pads on the solid state device.

Viewed from another aspect the present invention is directed to a solid state device assembly comprising a terminal board of an insulating material having a plurality of conductive bumps on a surface thereof; a solid state device having a plurality of conductive terminal pads on a surface thereof in a pattern corresponding to the pattern of the bumps on the terminal board, the solid state device terminal pads being over and adjacent the terminal board terminal pads; and a hardened amalgam between each of the bumps and its corresponding solid state device terminal pad bonding the solid state device to the terminal board.

Viewed from still another aspect the present invention is directed to a method of mounting a solid state device having a plurality of metal terminal pads on a terminal board having a plurality of metal terminal pads corresponding with the terminal pads on the solid state device comprising the steps of providing a metal bump on each of the terminal pads on the terminal board; applying an amalgam to each of the bumps; mounting the solid state device on the terminal board with the terminal pads on the solid state device contacting the amalgam on the bumps; and hardening the amalgam to bond the bumps to the terminal pads of the solid state device.

The invention will be better understood from the following more detailed description taken with the accompanying drawings and claims.

The drawings are not necessarily to scale.

DETAILED DESCRIPTION

Figure 1:
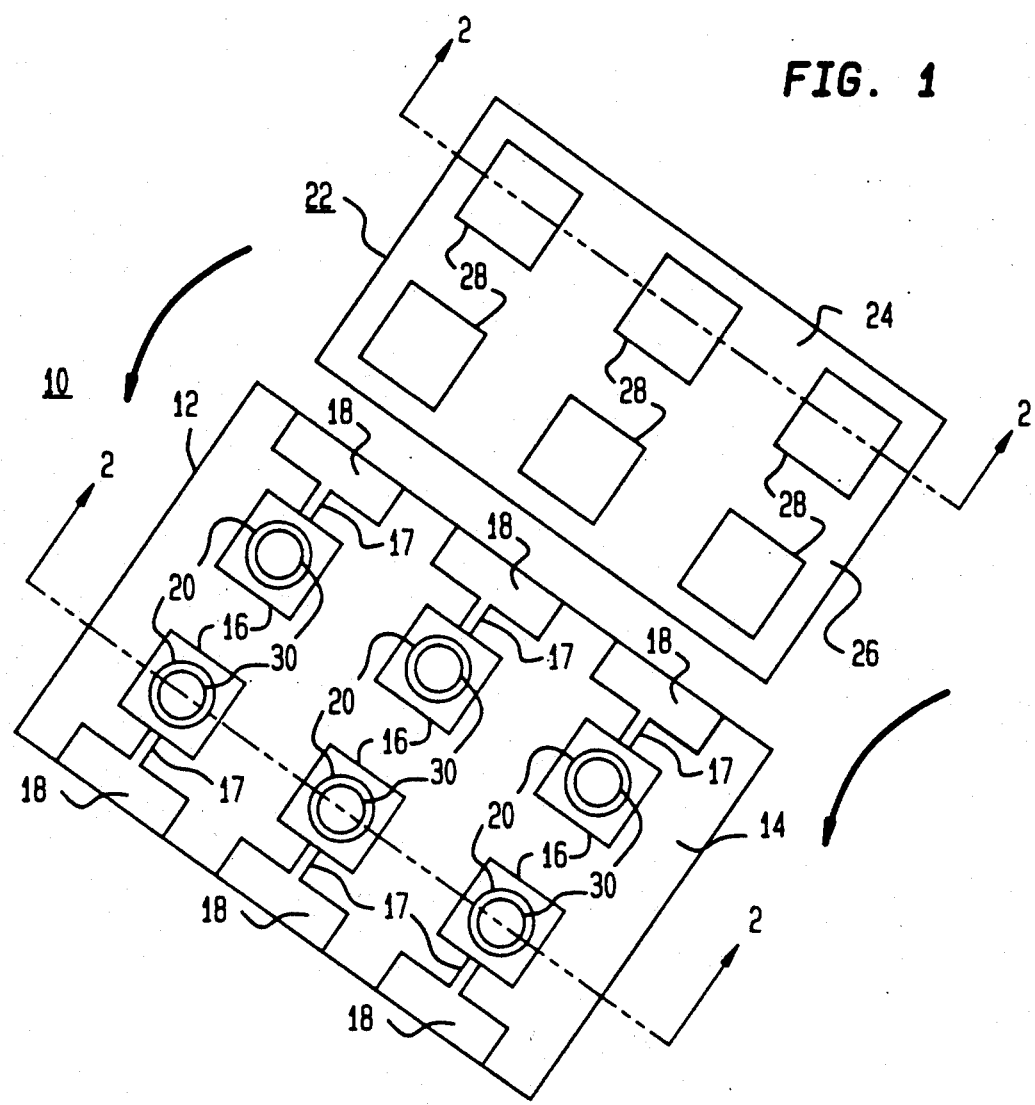
FIG. 1 is an exploded perspective view of a solid state device on a terminal board in accordance with the present invention.
Figure 2:
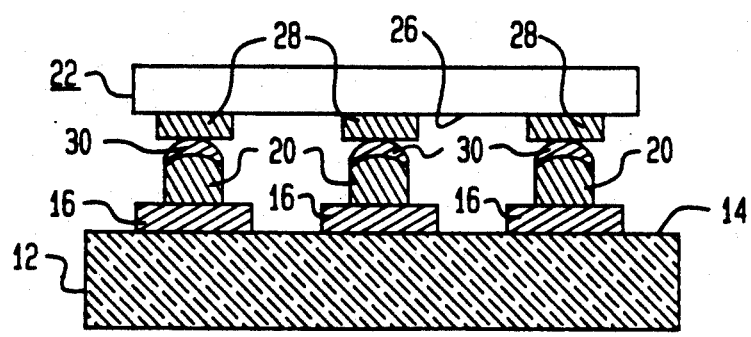
FIG. 2 is a sectional view taken through a dashed line 2—2 of FIG. 1.

Referring now to FIG. 1, there is shown an exploded view of a solid state device assembly 10 in accordance with the present invention. FIG. 2 shows a cross-sectional view of assembly 10 through a dashed line 2—2 of FIG. 1 after assembly 10 is assembled. Assembly 10 comprises a terminal board 12 of an insulating material (e.g., a transparent material such as glass) and a solid state device 22 (e.g., an integrated circuit solid state image sensor). Terminal board 12 has a surface 14 on which are a plurality of spaced apart terminal pads (contacts, electrical contacts) 16 of an electrical conductive material such as a metal or a combination of metals or metal layers. On each pad 16 is a terminal bump 20 of a conductive material such as a metal or a combination of metals. For example, each bump 20 may be of gold, copper or a tin/lead solder. On each bump is a bonding layer 30 in accordance with the present invention. Each pad 16 is shown connected to a separate conductive pad 18 through a separate conductive strip 17. The terminal pads 16 may be a layer of nichrome coated with a layer of copper and finally with a layer of gold and are arranged in a desired pattern. As shown, the terminal pads 16 are arranged in two spaced apart rows of three pads 16 each. Pads 18 and strips 17 are on surface 14. Solid-state device 22 comprises a substrate 24 having a surface 26 on which are a plurality of electrical contact pads 28 of a conductive metal (e.g., aluminum). The curved arrows of FIG. 1 indicate that device 22 is rotated 180 degrees and placed on the board 12 with each of the pads 28 covering a separate one of the bonding layers 30.

The solid state device 22 may be of any type, such as an integrated circuit. However, the assembly 10 of the present invention is most useful for solid state devices 22 which have features which cannot withstand high temperatures, such as a solid state image sensor having a filter layer. The solid state device 22 comprises a substrate 24 of a semiconductor material, such as single crystalline silicon, having the features of the solid state device, not shown, therein and thereon. In order to improve the bondability of the terminal pads 28 they may be coated with additional metal layers, such as titanium/tungsten/gold or chromium/copper/gold, or a layer of a material having therein the powdered metal of the amalgam. The terminal pads 28 are arranged in a pattern, generally along the edges of the substrate. The terminal pads 28 are electrically connected to the features of the particular device in the substrate 24. The pattern of the terminal pads 16 on the terminal board 12 correspond to the pattern of the terminal pads 28 on the solid state device 22. The solid state device 22 is mounted on the terminal board 12 with the terminal pads 28 being seated on the bonding layers 30.

The bonding layer 30 is an amalgam. The amalgam is a mixture of a liquid metal, such as mercury or gallium, and a metal powder or mixture of metal powders. The metal powder may be selected from a large number of metal well known for use in amalgams, such as copper, nickel, cobalt, gold, silver, tin, magnesium, antimony, manganese, chromium, titanium, molybdenum, aluminum, iron or combinations of these metals. In general, the liquid metal is present in the amalgam in the amount of 55% to 95% by weight. Gallium is preferred as the liquid metal because mercury is toxic and can adversely affect the electrical characteristics of certain types of solid state device. Copper and nickel are preferred as the powdered metal because they form amalgams which have desirable properties, are relatively inexpensive and readily available. In amalgams containing gallium as the liquid metal and powdered copper and/or nickel, the gallium is preferably present in the amount of 65% to 70% by weight. In the assembly 10 the amalgam bonding material 30 is a hardened layer between each bump 20 and its corresponding terminal pad 28 and is bonded to each.

To form the assembly 10, the amalgam bonding layer 30 is formed by mixing together the liquid metal and the powdered metal. This may be achieved manually using a container and a stainless steel pestle with a hammering action. However, it can also be achieved using a commercially available mechanical amalgamator. A small amount of the amalgam is then placed on each of the bumps 20 on the terminal board 12. This can be accomplished on each bump 20 using a dispenser such as shown in U.S. Pat. No. 4,754,900, to C. A. MacKay, issued Jul. 5, 1988, entitled "Method of and Apparatus for Dispensing a Controlled Amount of a Liquid Metal". However, this can more preferably be accomplished using a mass transfer technique. One mass transfer technique is to place the amalgam in a container and lower the terminal board 12 toward the amalgam until all of the bumps 20 make contact and are coated with the amalgam bonding layer 30. Another mass transfer technique is to form the amalgam into a frozen thin sheet. The terminal board 12 is then heated slightly to heat the bumps 20. The heated bumps 20 are then brought into contact with an amalgam sheet. The warm bumps 20 melt a small portion of the amalgam sheet which is transferred to the bumps as bonding layer 30. Slight ultrasonic or mechanical scrubbing enhances this process.

Immediately after the amalgam bonding layer 30 is applied to the bumps 20, the solid state device 22 is mounted on the terminal board 12 with the terminal pads 28 contacting the amalgam bonding layer 30 on the bumps. This may be accomplished using a standard flip chip bonder. Slight heat and agitation may again be used to facilitate the initial bonding. The final bond between the amalgam bonding layer 30 and the bumps 20 and terminal pads 28 may be achieved at room temperature. However, this takes an extended period of time and can result in multiple final metallurgical phases. To reduce the time to achieve the final bond, the assembly 10 is preferably heated at a relatively low temperature. One such cycle would be at 80° C. for about 6 to 8 hours. If desired, the solid state device 22 may be clamped to the terminal board 12 during the heating process. Thus, the solid state device 22 is bonded to the terminal board 12 at low temperatures which will not adversely affect any features of the solid state device 22. However, once the amalgam 30 is set, it can withstand much higher temperatures. For example, an amalgam of liquid gallium, powdered copper and powdered nickel, once set, can withstand temperatures up to about 250° C.

Thus, there is provided by the present invention an assembly of a solid state device mounted on a terminal board using terminal bumps using an amalgam to bond the solid state device to the terminal bumps. This allows the assembly to be formed at relatively low temperatures which do not adversely affect any of the features of the solid state device, but which will withstand much higher temperatures after the bond is formed. Thus the assembly can be used for solid state devices which have features which cannot withstand high temperatures, such as solid state image sensors having filter layers.

It is to be appreciated and understood that the specific embodiments of the invention are merely illustrative of the general principles of the invention. Various modifications may be made consistent with the principles set forth. For example, the terminal board can be of any insulating material, such as a plastic or a ceramic. Still further, the terminal pads can be of any desired conductive material and can be arranged in any pattern corresponding to the pattern on the solid state device. Still further, the pads 16 can in some applications be eliminated with conductive strips 17 then being extended to directly contact bumps 20.

What is claimed is:

1. A solid state device assembly comprising:
   a pattern of conductive bumps only on a surface of a terminal board of an insulating material;
   a solid state image sensor device which has features which cannot withstand high temperatures and which has a plurality of conductive terminals pads on a surface thereof in a pattern corresponding to the pattern of the conductive bumps on the terminal board, the solid state image sensor device terminal pads being over and adjacent the terminal board conductive bumps; and
   a hardened amalgam between each of the conductive bumps and its corresponding solid state image sensor device terminal pad bonding the solid state image sensor device to the terminal board.

2. The solid state device assembly of claim 1 further comprising:
   a plurality of metal terminal pads on the surface of the terminal board with the bumps lying thereon; and
   wherein the amalgam is a mixture of a liquid metal and a powdered metal and the conductive pads of the device and the bumps are metal.

3. The solid state device assembly of claim 2 in which the liquid metal is selected from the group consisting of mercury and gallium.

4. The solid state device assembly of claim 3 in which the powdered metal is selected from the group consisting of copper, nickel, cobalt, gold, silver, tin, magnesium, antimony, manganese, chromium, titanium, molybdenum, aluminum, iron and combinations thereof.

5. The solid state device assembly of claim 4 in which the liquid metal is present in the amalgam in the amount of 55% to 95% by weight.

6. The solid state device assembly of claim 1 in which the terminal board is of a transparent material.

7. The solid state device assembly of claim 6 in which the terminal board is of glass.

8. A method of mounting a solid state image sensor device having a plurality of metal terminal pads on a terminal board having a plurality of metal terminal pads corresponding with the terminal pads of the solid state image sensor device comprising the steps of:
   providing a metal bump on only each of the terminals pads of the terminal board;
   applying an amalgam to each of the metal bumps;
   mounting the solid state image sensor device on the terminal board with the terminal pads on the solid state image sensor device contacting the amalgam on the metal bump; and
   hardening the amalgam to bond the metal bumps to the terminal pads of the solid state device.

9. The method of claim 8 in which the amalgam is a mixture of a liquid metal and a powdered metal.

10. The method of claim 9 in which the amalgam is applied to the bumps by dropping some of the amalgam on each of the bumps.

11. The method of claim 9 in which the amalgam is applied by mass transfer techniques to the bumps by placing the amalgam in a container and moving the terminal board toward the container until the bumps contact the amalgam.

12. The method of claim 9 in which the amalgam is applied to the bumps by heating the bumps slightly and pressing the heated bumps against a sheet of frozen amalgam to melt the amalgam and coat the bumps.

13. The method of claim 12 in which a slight mechanical scrubbing is provided between the bumps and the sheet of amalgam to assist the coating of the bumps with the amalgam.

14. The method of claim 9 in which after the solid state device is mounted on the terminal board, a mechanical scrubbing action is provided between the terminal pads on the solid state device and the amalgam on the bumps to bond the amalgam to the terminal pads.

15. The method of claim 9 in which the amalgam is hardened by heating the assembly at a relatively low temperature.

16. The method of claim 9 in which the solid state device is clamped to the terminal board while the amalgam is being hardened.

17. The method of claim 9 in which the liquid metal is selected from the group consisting of mercury and gallium.

18. The method of claim 17 in which the powdered metal is selected from the group consisting of copper, nickel, cobalt, gold, silver, tin, magnesium, antimony, manganese, chromium, titanium, molybdenum, aluminum, iron and combinations thereof.

19. The method of claim 18 in which the liquid metal is present in the amalgam in the amount of 55% to 95% by weight.

* * * * *